United States Patent [19]

Shu et al.

[11] Patent Number: 5,378,498

[45] Date of Patent: Jan. 3, 1995

[54] ANTISTATIC SOLUTION FOR MICROLITHIC MEASUREMENT

[75] Inventors: Jing S. Shu, Austin; Chien S. Liang; Grover W. Trytten, both of Plano; Yvonne D. Satterfield, Dallas, all of Tex.

[73] Assignee: Texas Instruments Incorporated, Dallas, Tex.

[21] Appl. No.: 198,684

[22] Filed: Feb. 18, 1994

Related U.S. Application Data

[63] Continuation of Ser. No. 722,806, Jun. 28, 1991, abandoned.

[51] Int. Cl.$^6$ ............................................... B05D 1/00
[52] U.S. Cl. ........................................ 427/240; 427/314; 427/316; 427/508
[58] Field of Search ................ 427/314, 240, 508, 316

[56] References Cited

U.S. PATENT DOCUMENTS

| | | | |
|---|---|---|---|
| 3,933,516 | 1/1976 | Mackey | 106/135 |
| 4,115,120 | 9/1978 | Dyer | 427/314 |
| 4,214,035 | 7/1980 | Heberger | 427/171 |
| 4,369,208 | 1/1983 | Okunaka | 427/314 |
| 4,711,816 | 12/1987 | Wittnebel | 427/108 |
| 4,973,338 | 11/1990 | Gaeta | 51/295 |
| 4,980,205 | 12/1990 | Haskell | 427/314 |

*Primary Examiner*—Shrive Beck
*Assistant Examiner*—Vi Duong Dang
*Attorney, Agent, or Firm*—W. James Brady, III; Richard L. Donaldson

[57] ABSTRACT

An antistatic solution is disclosed to aid in the measurement of patterned resists by scanning electronic microscopes. The solution comprises a quaternary ammonium salt and a suitable solvent. The anion of the salt is selected from the group consisting of saccharinate, nitrate, sulfates, alkyl sulfates and alkoxylate. The four groups of the cation are selected from the group consisting of alkyl and alkyl derivatives.

10 Claims, No Drawings

ANTISTATIC SOLUTION FOR MICROLITHIC MEASUREMENT

This application is a continuation of application Ser. No. 07/722,806, filed Jun. 28, 1991, now abandoned.

TECHNICAL FIELD OF THE INVENTION

This invention relates in general to the field of measurement methods and devices and in particular to an antistatic solution for fine line and geometric measurement by a scanning electron microscope and method for using.

BACKGROUND OF THE INVENTION

A resist is a layer of a material that adheres to a substrate during semiconductor fabrication. A pattern of openings is formed in the resist through which the substrate is etched or impurities are implanted. The pattern in the resist may be formed, for instance, by exposing certain portions of the resist to ultraviolet (UV) light and etching with a suitable chemical. Sizing control of resist openings or geometries during integrated circuit ("IC") manufacturing is therefore essential to the success of product fabrication.

As circuit complexity is increased, either the size of the ICs or the density of the circuitry must increase. For a number of reasons, small device size is desirable. circuit density and resist geometry size must therefore be minimized. This decrease in geometry size has put a strain on linewidth control efforts. For a smaller geometry, the same sizing variation will have a proportionately greater effect.

Many factors in the pattern transfer process can adversely affect the sizing of geometries. These include resist coating thickness, imaging tool conditions, temperature and concentration of developer, and the etching equipment conditions, among others. Even if all the factors which influence sizing are constantly monitored and adjusted to bring them into control, the final pattern size itself must be measured before further processing to assure that the desired sizing is achieved.

Sizing measurement to monitor and control resist geometries is done using two techniques. The first technique uses an optical instrument to measure the linewidth and geometry of a resist. The resolution of this type of instrument is limited by the wavelength of visible light to around 1.2 micrometers. Optical linewidth measurement is also sensitive to substrate conditions and to the edge profile of the resist geometries being measured.

Where the geometry needed to be measured approaches 1 micrometer, most fabrication facilities find it necessary to use a second technique. There, a scanning electronic microscope (SEM) is used to precisely monitor critical resist dimensions. Recent advances in SEM technology make it now possible to efficiently use SEMs in production lines without destroying the measured product.

Although SEMs can measure geometries smaller than one micrometer, a charging phenomenon increases the uncertainty of the ultimate measurement. This charging phenomenon arises because the number of electrons emitted from the SEM and impinging upon the surface of the measured substrate is greater than the number of electrons emitted from the substrate. This ultimately degrades the focusing ability and hence the resolution of the SEM. The charging problem is aggravated when a nonconductive resist pattern lies on top of a conductive substrate and after baking.

Several techniques have been developed to minimize the electron charging phenomenon. The phenomenon can be minimized by using a lower electron beam current, by tilting the substrate with respect to the beam, and by adding water or other chemicals to the resist. Fewer electrons penetrate into the substrate at lower currents but fewer electrons will be present to illuminate the subject. Similarly, fewer electrons penetrate a substrate when the electrons strike at an oblique angle. Most SEMs, however, are not able to tilt their subject. Furthermore, poor conductors, even when tilted, will charge under prolonged exposure. The water content in an organic resist is unfortunately decreased to a level which makes it ineffective in controlling charging after most patterning and developing processes. Baked or etched resists are further hardened such that virtually no water exists in or on the surface of the resist. Finally, adding electrolytes is undesirable because they change the etching properties of the resist.

Therefore, a need has arisen for an antistatic coating for integrated circuits which permits precise linewidth measuring by a SEM, which does not require modification to existing SEMs to be compatible therewith, and which does not interact with the wafer chemistry during fabrication.

SUMMARY OF THE INVENTION

In accordance with the present invention, an antistatic solution is provided which substantially eliminates or reduces disadvantages and problems associated with prior scanning electronic microscope measurement methods.

An antistatic solution used for fine line and geometric measurement by a scanning electronic microscope comprises a quaternary ammonium salt having an anion selected from the group consisting of sacchariante, nitrate, sulfonates, alkyl sulfates and alkoxylate sulfates. The four groups of the cation are selected from the group consisting of alkyl and alkyl derivatives.

A first technical advantage of the disclosed invention is its ability to dissipate a charge caused by a scanning elecion microscope.

Another technical advantage of the disclosed invention is that it does not require the modification of existing SEMs or the development of new wafer production techniques to use.

A third technical advantage of the disclosed invention is its thickness when applied to a substrate. The solution dries to form a very thin layer which does not itself contribute to the dimension of the measured structure.

A final technical advantage of the disclosed invention is its inertness with present semiconductor materials and processes.

DETAILED DESCRIPTION OF THE INVENTION

An antistatic solution including one of a class of quaternary ammonium salts can minimize the charging phenomenon induced by a scanning electron microscope. The salts each have the following chemical formula:

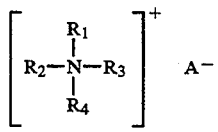

A can be saccarinate, nitrate, sulfonates, alkyl sulfates, alkoxylate sulfates and mixtures thereof. The four groups $R_1$, $R_2$, $R_3$, and $R_4$, can be alkyl or derivatives of alkyl. $R_1$, $R_2$, $R_3$, and $R_4$ can each be different from one another. The only limitations placed on the four groups $R_1$, $R_2$, $R_3$, and $R_4$ are those of solvent solubility and resist compatibility. In particular, when the number of carbons in any one group or the total number of carbon atoms becomes large in all groups, it is necessary to dissociate the salt in an alcohol/water mixture. Alcohols such as methanol, ethanol, propanol, butanol and their isomers, as mixed with water, may be so used.

Also, certain alkyl groups, particularly ones with long carbon chains, will cause the resulting salt to dissolve an unbaked or un-UV-hardened photoresist when the salt is applied to the photoresist. Resists which are UV-hardened or sufficiently baked place no such limitations on the alkyl groups.

The quaternary ammonium salt dissociates in an aqueous or alcohol solvent. The dissociated salt, when applied to a resist, adheres as a thin film and retains a small amount of solvent even after it dries. Water in the solvent (as well as water in the air) absorbed by the salt in its film form conducts the negative charge caused by the SEM away from any localized points of concentration.

The antistatic solution is prepared by dissolving an amount of antistatic agent into a suitable solvent such as deionized water, or an alcohol and water mixture, as discussed above. The total percentage of antistatic agent should be about 0.1 to 5% by weight of the solution to insure a proper coating thickness when dry. For inline resist linewidth measurement, the antistatic solution is spin coated onto the resist patterned wafer and allowed to puddle. The antistatic agent is thereby absorbed into the surface of the resist. The wafer is then spun-dried at high speed of rotation to remove excess solvent.

EXAMPLE

A solution is prepared by dissolving 3.3 grams of stearamidopropyldimethyl hydroxyethylammonium nitrate in 996.7 grams of deionized water and then filtered through a 0.2 micrometer filter. The solution is then dispensed onto the resist patterned wafers while the wafer is spinning at a speed of 300 rpm for 23 seconds. The wafer comes to a stop and more solution is dispensed while the wafer is stationary to make sure that the entire wafer is covered with solution. The wafer then sits idle for 20 seconds before it is spun dry at 4000 rpm for 10 seconds.

Resists treated this way are found to allow easier SEM focus adjustment and to allow less charge buildup during measurement. By keeping the salt concentration low in the solvent, the antistatic film does not itself contribute to the measured structures.

What is claimed is:

1. A method for forming a charge-dissipating coating over a patterned resist formed on a substrate comprising the steps of:
    dissociating a quaternary ammonium salt with a solvent; and
    forming a thin coating over the patterned resist with the dissociated salt.

2. The method of claim 1 wherein said dissociating step comprises the step of dissociating stearamidopropyldimethyl hydroxyethylammonium nitrate.

3. The method of claim 1 in which the salt to solvent weight ratio is 0.1 to less than 5%.

4. A method of forming a charge-dissipating coating over a patterned resist formed on a substrate comprising the steps of:
    forming an aqueous mixture of stearamidopropyldimethyl hydroxyethylammonium nitrate having solute to solvent weight ratio of 0.1 to less than 5%; and
    coating the patterned resist with the mixture.

5. The method of claim 4 further comprising the step of spinning the patterned resist dry.

6. The method of claim 4 wherein said step of forming further comprises the step of combining 0.33 percent by weight of stearamidopropyldimethyl hydroxyethylammonium nitrate and 99.67 percent by weight of water.

7. The method of claim 4 further comprising the step of UV-hardening the resist prior to said step of coating.

8. The method of claim 4, and further comprising the step of baking the resist prior to said step of coating.

9. A method of forming a charge-dissipating coating over a patterned resist formed on a substrate comprising the steps of:
    dissociating a quaternary ammonium salt with a solvent, the salt having an anion selected from the group consisting of saccharinate, nitrate, sulfonates, alkyl sulfates, and alkoxylate, and having four cation organo groups each selected from the group consisting of alkyl and derivatives of alkyl; and
    coating a resist layer with a thin layer of the dissociated salt.

10. The method of claim 9 in which the salt to solvent weight ratio is 0.1 to less than 5%.

* * * * *